United States Patent
Chen et al.

(10) Patent No.: US 11,156,659 B2
(45) Date of Patent: Oct. 26, 2021

(54) OPTIMIZATION AND SCHEDULING OF THE HANDLING OF DEVICES IN THE AUTOMATION PROCESS

(71) Applicant: Advantest Corporation, Tokyo (JP)

(72) Inventors: Leon Chen, San Jose, CA (US); Rotem Nahum, Sunnyvale, CA (US)

(73) Assignee: Advantest Corporation, Tokyo (JP)

( * ) Notice: Subject to any disclaimer, the term of this patent is extended or adjusted under 35 U.S.C. 154(b) by 479 days.

(21) Appl. No.: 16/189,137

(22) Filed: Nov. 13, 2018

(65) Prior Publication Data
US 2020/0150178 A1  May 14, 2020

(51) Int. Cl.
*G01R 31/3177* (2006.01)
*G01R 31/317* (2006.01)

(52) U.S. Cl.
CPC ... *G01R 31/31718* (2013.01); *G01R 31/3172* (2013.01)

(58) Field of Classification Search
CPC .......... G01R 31/3172; G01R 31/31836; G01R 31/31718
See application file for complete search history.

(56) References Cited

U.S. PATENT DOCUMENTS

| | | | | |
|---|---|---|---|---|
| 2004/0225459 A1* | 11/2004 | Krishnaswamy | ........................... | G01R 31/318307 702/57 |
| 2005/0268171 A1* | 12/2005 | House | ................. | G06F 11/2273 714/32 |
| 2014/0032637 A1* | 1/2014 | Weir | ..................... | G06F 11/273 709/203 |
| 2014/0070828 A1* | 3/2014 | Andberg | ............ | G01R 31/2893 324/750.02 |

\* cited by examiner

*Primary Examiner* — Nghia M Doan

(57) ABSTRACT

A system for performing an automated test is disclosed. The method comprises receiving a plurality of work orders and a plurality of constraints for scheduling a plurality of tests on a plurality of DUTs using automated test equipment (ATE) available on a production floor, wherein the ATE comprises a plurality of test cells, and wherein each test cell comprises a plurality of testers and an automated handler. The method further comprises developing a test plan to execute the plurality of tests, wherein the test plan is customized in accordance with the information in the plurality of work orders and the plurality of constraints. Finally, the method comprises scheduling the plurality of tests to the plurality of test cells to maximize throughput of the plurality of DUTs.

18 Claims, 12 Drawing Sheets

OPTIMIZATION AND SCHEDULING OF THE HANDLING OF DEVICES IN THE AUTOMATION PROCESS

FIELD OF THE INVENTION

The present disclosure relates generally to the field of automated test equipment and more specifically to techniques of optimizing and scheduling the handling of devices in the automation process.

BACKGROUND OF THE INVENTION

Automated test equipment (ATE) can be any testing assembly that performs a test on a semiconductor wafer or die, an integrated circuit (IC), a circuit board, or a packaged device such as a solid-state drive. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

When a typical ATE system tests a device (commonly referred to as a device under test or DUT), the ATE system applies stimuli (e.g. electrical signals) to the device and checks responses (e.g., currents and voltages) of the device. Typically, the end result of a test is either "pass" if the device successfully provides certain expected responses within pre-established tolerances, or "fail" if the device does not provide the expected responses within the pre-established tolerances. More sophisticated ATE systems are capable of evaluating a failed device to potentially determine one or more causes of the failure.

It is common for an ATE system to include a computer that directs the operation of the ATE system. Typically, the computer runs one or more specialized software programs to provide (i) a test development environment and (ii) a device testing environment. In the test development environment, a user typically creates a test program, e.g., a software-based construct of one or more files that controls various portions of the ATE system. In the device testing environment, the user typically provides the ATE system with one or more devices for testing, and directs the ATE system to test each device in accordance with the test program. The user can test additional devices by simply providing the additional devices to the ATE system, and directing the ATE system to test the additional devices in accordance with the test program. Accordingly, the ATE system enables the user to test many devices in a consistent and automated manner based on the test program.

Most, conventional device testing environments do not comprise automated tester handlers for handling the devices under test (DUTs), e.g., conventional SSD tester systems are not equipped with automated handlers. In other words, the technicians need to manually load the tester with the DUTs and replace the DUTs with additional untested DUTs once the prior set of DUTs is finished testing. Therefore, loading, moving and racking the DUTs are performed manually. Accordingly, the test development environments for conventional ATE systems are not configured to automate the handling of DUTs, e.g., SSD devices. Because conventional ATE systems do not comprise automated handlers for the DUTs, users of the test development environment are not provided any ability to perform any optimizations with the automation process to maximize throughput.

Furthermore, conventional testing platforms do not provide customers other ways of customizing the testing process to meet their testing requirements. Customers, for example, are not provided the ability to add requirements and information specific to them, e.g., the devices under test (DUTs) they needed to test, test priorities, and available test resources.

BRIEF SUMMARY OF THE INVENTION

Accordingly, a need exists for a test development environment offering automatic DUT handling that can easily be adapted for different customers of the test system. More specifically, what is needed is a test development environment that allows customers of the ATE system to customize the testing process. Also, what is needed is a test development environment that can schedule, among other things, the automated handling of the ATE system in a way that optimizes the test process to maximize throughput. Using the beneficial aspects of the systems described, without their respective limitations, embodiments of the present invention provide a novel solution to address these problems.

Embodiments of the present invention provide customers the ability to perform optimizations related to their specific tests including automated DUT handling and provide efficient throughput and cost savings. Prior art systems by comparison did not have any automation for testing DUTs and could not provide customer specific customizations or optimizations with respect to automated DUT handling.

Embodiments of the present invention allow customer specific criteria and priorities to be taken into account when scheduling tests for DUTs. Because the system is modular (e.g., primitives, DUT protocols, and interfaces can be swapped), the tester software can optimize and customize several aspects of the testing process to maximize throughput based on the customer-specific parameters. The flexibility of the testing system allows it to accommodate a wide range of scheduling requests—the tester system can be reconfigured in various way to minimize costs and optimize the throughput while taking into account customer specific requirements. For example, the testing system of the present invention can exploit all the resources of the system, e.g., the primitives, the robots, loading stations, binning stations, etc. to design a test process for the customer that maximizes throughput and allocation of work to particular pieces of equipment.

In one embodiment, for example, the customer may be able to input a set of constraints specific to the customer into the tester system. The tester software uses the constraints in addition to pre-programmed information regarding the test process to schedule the various tests the customer needs to perform. Further, the tester software determines an optimal layout and configuration of the test equipment for performing the tests.

Embodiments of the present invention also enable customers to integrate their specific modules into the system— the configurability of the tester system accommodates changes in protocol and allows the customer to readily integrate their requirements into the tester system. Accordingly, embodiments of the present invention advantageously leverage the modularity and flexibility of both the tester hardware and software to allow better production throughput and flexibility with scheduling.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Figure 1A:
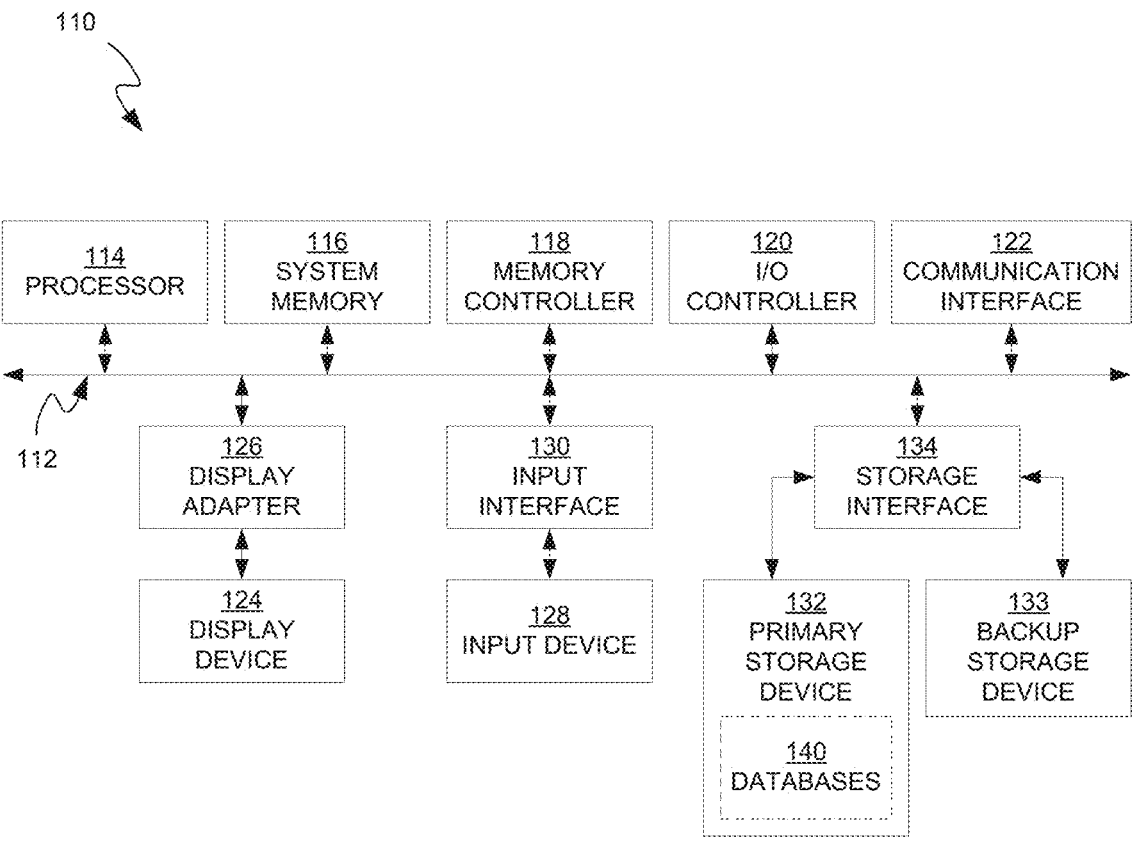
FIG. 1A is a block diagram of an example of a tester control system operable to customize the testing process and optimize, among other things, the handling of devices during the automated testing process to maximize throughput in accordance with embodiments of the present invention.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "receiving," "configuring," "programming," "integration," "providing," "executing," or the like, refer to actions and processes (e.g., flowchart 800 of FIG. 8 and flowchart 900 of FIG. 9) of a computer system or similar electronic computing device or processor (e.g., system 110 of FIG. 1A). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

FIG. 1A is a block diagram of an example of a tester control system 110 operable to customize the testing process and optimize, among other things, the handling of devices during the automated testing process to maximize throughput in accordance with embodiments of the present invention. Tester control system 110 broadly represents any single or multi-processor computing device or system capable of executing computer-readable instructions. Examples of control system 110 include, without limitation, workstations, laptops, client-side terminals, servers, distributed computing systems, handheld devices, or any other computing system or device. In its most basic configuration, control system 110 may include at least one processor 114 and a system memory 116.

Processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments control system 110 may include both a volatile memory unit (such as, for example, system memory 116) and a non-volatile storage device (such as, for example, primary storage device 132).

Tester control system 110 may also include one or more components or elements in addition to processor 114 and system memory 116. For example, in the embodiment of FIG. 2A, control system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of control system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of control system 110, such as processor 114, system memory 116, communication interface 122, display adapter 126, input interface 130, and storage interface 134.

Communication interface 122 broadly represents any type or form of communication device or adapter capable of facilitating communication between example control system 110 and one or more additional devices. For example, communication interface 122 may facilitate communication between control system 110 and a private or public network including additional control systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between control system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow control system 110 to engage in distributed or remote computing. For example, communication interface 122 may receive instructions from a remote device or send instructions to a remote device for execution.

As illustrated in FIG. 1A, control system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 1A, control system 110 may also include at least one input device 128 coupled to communication infrastructure 112 via an input interface 130. Input device 128 generally represents any type or form of input device capable of providing input, either computer- or human-generated, to control system 110. Examples of input device 128 include, without limitation, a keyboard, a pointing device, a speech recognition device, or any other input device.

As illustrated in FIG. 1A, control system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of control system 110.

In one example, databases 140 may be stored in primary storage device 132. Databases 140 may represent portions of a single database or computing device or it may represent multiple databases or computing devices. For example, databases 140 may represent (be stored on) a portion of control system 110 and/or portions of example network architecture 200 in FIG. 2 (below). Alternatively, databases 140 may represent (be stored on) one or more physically separate devices capable of being accessed by a computing device, such as control system 110 and/or portions of network architecture 200.

Continuing with reference to FIG. 1A, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into control system 110. For example, storage devices 132 and 133 may be configured to read and write software, data, or other computer-readable information. Storage devices 132 and 133 may also be a part of control system 110 or may be separate devices accessed through other interface systems.

Many other devices or subsystems may be connected to control system 110. Conversely, all of the components and devices illustrated in FIG. 1A need not be present to practice the embodiments described herein. The devices and subsystems referenced above may also be interconnected in different ways from that shown in FIG. 1A. Control system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into control system 110. All or a portion of the computer program stored on the computer-readable medium may then be stored in system memory 116 and/or various portions of storage devices 132 and 133. When executed by processor 114, a computer program loaded into control system 110 may cause processor 114 to perform and/or be a means for performing the functions of the example embodiments described and/or illustrated herein. Additionally or alternatively, the example embodiments described and/or illustrated herein may be implemented in firmware and/or hardware.

Figure 1B:
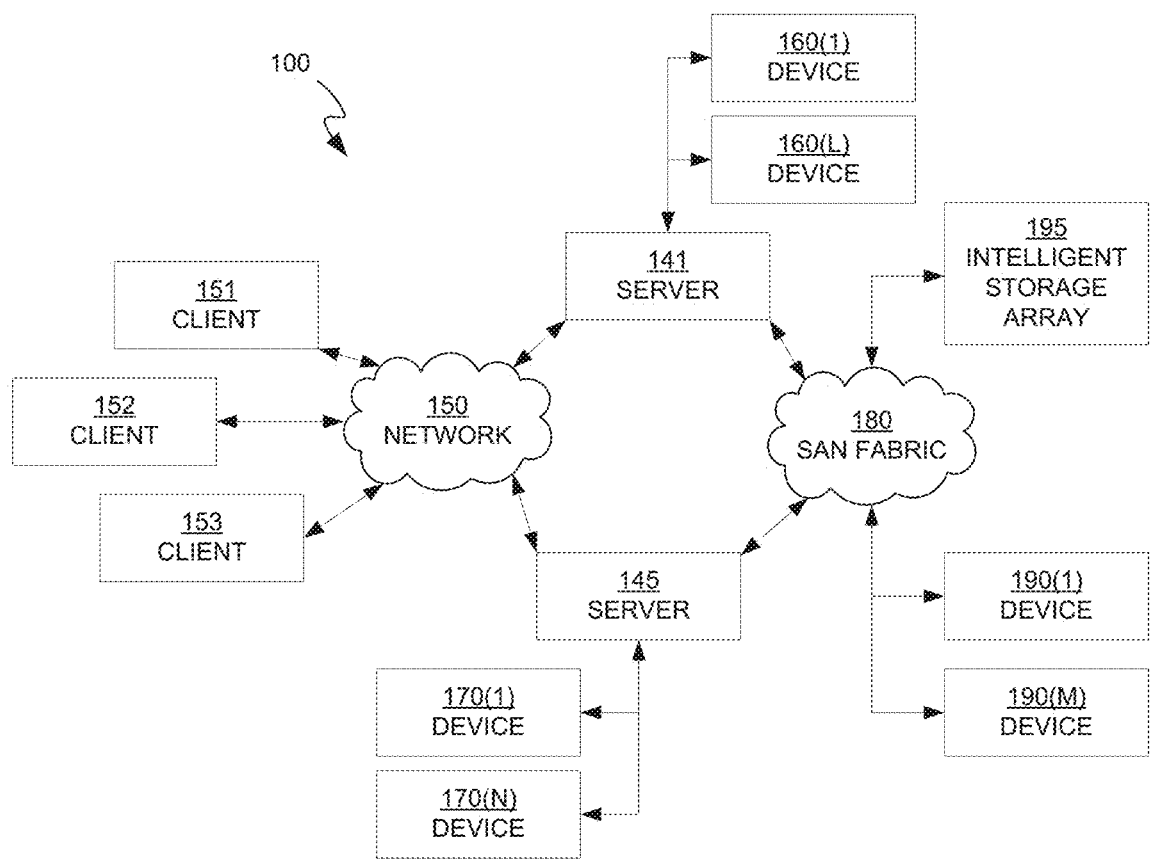
FIG. 1B is a block diagram of an example of a network architecture in which client systems and servers may be coupled to a network.

FIG. 1B is a block diagram of an example of a network architecture 100 in which client systems 151, 152 and 153 and servers 141 and 145 may be coupled to a network 150. Client systems 151, 152 and 153 generally represent any type or form of computing device or system.

Similarly, servers 141 and 145 (e.g. tester control system 110 of FIG. 1A) generally represent computing devices or systems, such as application servers or database servers, configured to provide various database services and/or run certain software applications. FIG. 1A may be representative of the manner in which the tester control system 110 of FIG. 1A connects to other tester control systems (e.g. other servers) or to other test cells (e.g. client systems 151-153) and test devices on the test floor.

Network 150 generally represents any telecommunication or computer network including, for example, an intranet, a wide area network (WAN), a local area network (LAN), a personal area network (PAN), or the Internet. The network 150 may, for example, connect several tester control systems, e.g., control 110 through a cloud platform.

With reference to control system 100 of FIG. 1B, a communication interface, such as communication interface 122, may be used to provide connectivity between each client system 151, 152 and 153 and network 150. Client systems 151, 152 and 153 may be able to access information on server 141 or 145 using, for example, a Web browser or other client software. Such software may allow client systems 151, 152 and 153 to access data hosted by server 140, server 145, storage devices 160(1)-(L), storage devices 170(1)-(N), storage devices 190(1)-(M), or intelligent storage array 195. Although FIG. 1B depicts the use of a network (such as the Internet) for exchanging data, the embodiments described herein are not limited to the Internet or any particular network-based environment.

In one embodiment, all or a portion of one or more of the example embodiments disclosed herein are encoded as a computer program and loaded onto and executed by server 141, server 145, storage devices 160(1)-(L), storage devices 170(1)-(N), storage devices 190(1)-(M), intelligent storage array 195, or any combination thereof. All or a portion of one or more of the example embodiments disclosed herein may also be encoded as a computer program, stored in server 141, run by server 145, and distributed to client systems 151, 152 and 153 over network 150.

Optimization and Scheduling of the Handling of Devices in the Automation Process Conventional device testing environments do not comprise automated tester handlers for handling the devices under test (DUTs), e.g., conventional SSD tester systems were not equipped with automated handlers for loading, testing or moving DUTs, etc. In other words, the technician would need to manually load the tester with the DUTs and replace the DUTs with additional untested DUTs once the prior set of DUTs is finished testing.

Accordingly, the test development environments for conventional ATE systems are not configured to automate the physical handling of DUTs, e.g., SSD devices. Because conventional ATE systems do not comprise automated handlers for the DUTs, users of the test development environment are not provided any ability to perform any optimizations with the automation process to maximize throughput. Furthermore, conventional testing platform do not provide customers other ways of customizing the testing process to meet their testing requirements.

Embodiments of the present invention comprise ATE systems that allow customers to customize the testing process. The test development environments of the ATE systems allow the customers to create specific customizations to the testing process based on the customer's unique needs. Further, embodiments of the present invention allow automation of the testing process (e.g., SSD testing) by providing ATE systems that comprise automated handlers. The customers are allowed to make customizations to the testing process and control the automated handlers in a way that maximizes throughput. Additionally, customers are allowed to make other customizations and modifications to the testing process based on other factors specific to the customer, e.g., number of testers on the test floor, type of testers, types of DUT protocols being tested, etc.

Embodiments of the present invention also provide modularized handling equipment that can be customized based on customer need. As will further discussed in connection with FIGS. 4A and 4B, embodiments of the present invention provide primitives that are modular and capable of operating independently from other primitives. A plurality of primitives can be set in a rack (as shown in FIG. 4B) where each can be operating under a different test plan. Each of the primitives can be customized based on the customer need, e.g., each primitive can be configured to test DUTs using a different protocol than the other primitives.

Further, embodiments of the present invention provide test development environments that allow customers to optimize the automated test process in a way that maximizes throughput. The optimizations may, for example, be related to efficient movement and scheduling of DUTs through the tester based on the type of tests performed on each device.

Figure 2:
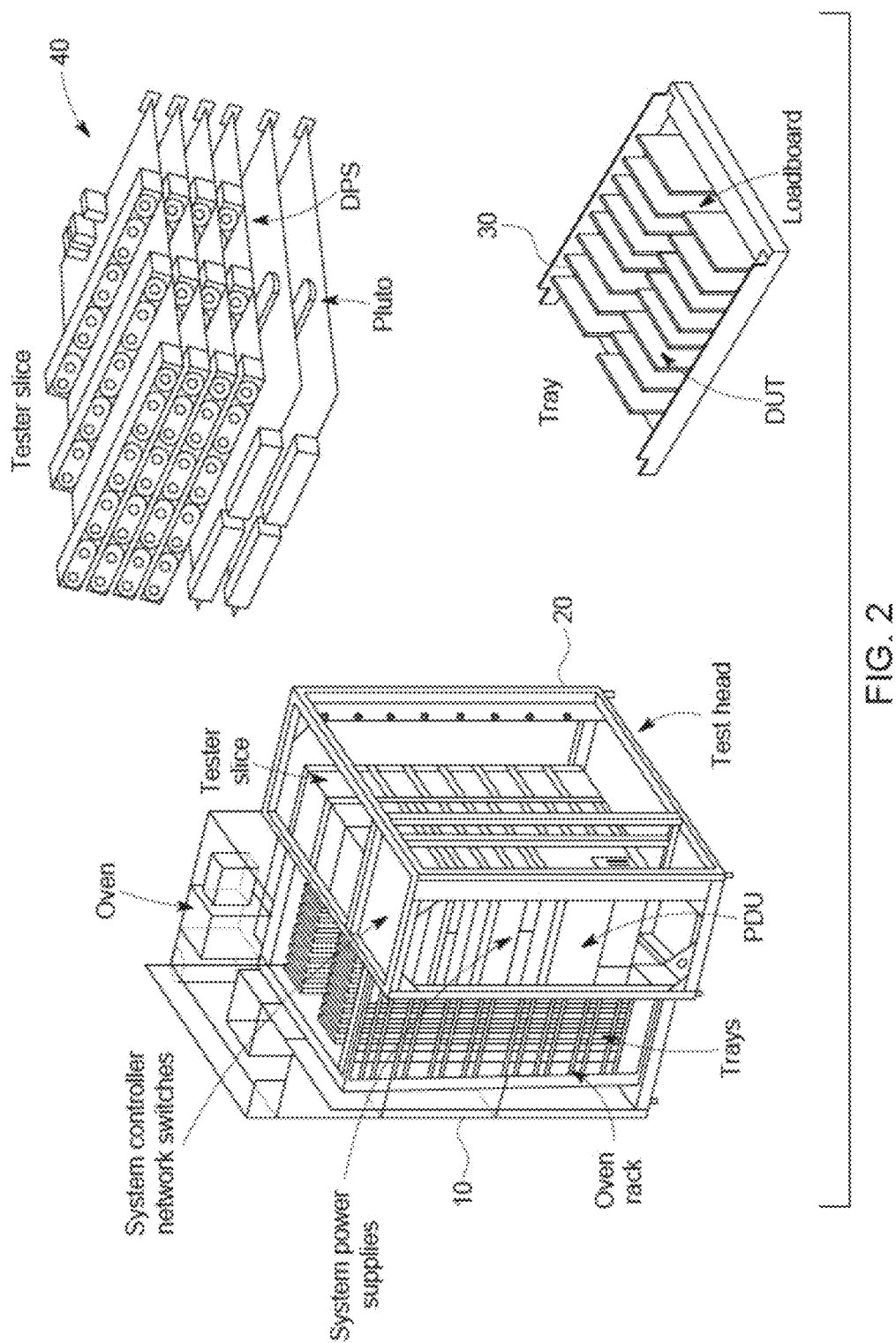
FIG. 2 illustrates a typical testing environment in which DUTs are placed into a controlled environmental chamber.

FIG. 2 illustrates a typical testing environment in which DUTs are placed into a controlled environmental chamber 10 or "oven." The DUTs are connected to tester slices of a test head 20. Many DUTs can be connected to a single tester slice 40. The tester slices contain the test circuitry, which performs tests on the DUTs in accordance with a test plan. There can be many tester slices per test head 20. The DUTs are placed into trays 30 when inserted into the oven 10. When in the oven 10, the DUTs are typically not user accessible so as to not disturb the controlled environment of the chamber 10. In a typical environmental chamber, the plurality of tester slices operate in lock step executing the same test plan on the plurality of DUTs. Further, the test head is typically controlled by a single controller computer system (not shown) that is directly connected to the test head and, in this fashion, controls all of the slices of the test head 20. The controller computer is typically operated by a single user executing a single test plan on the DUTs.

Figure 3:
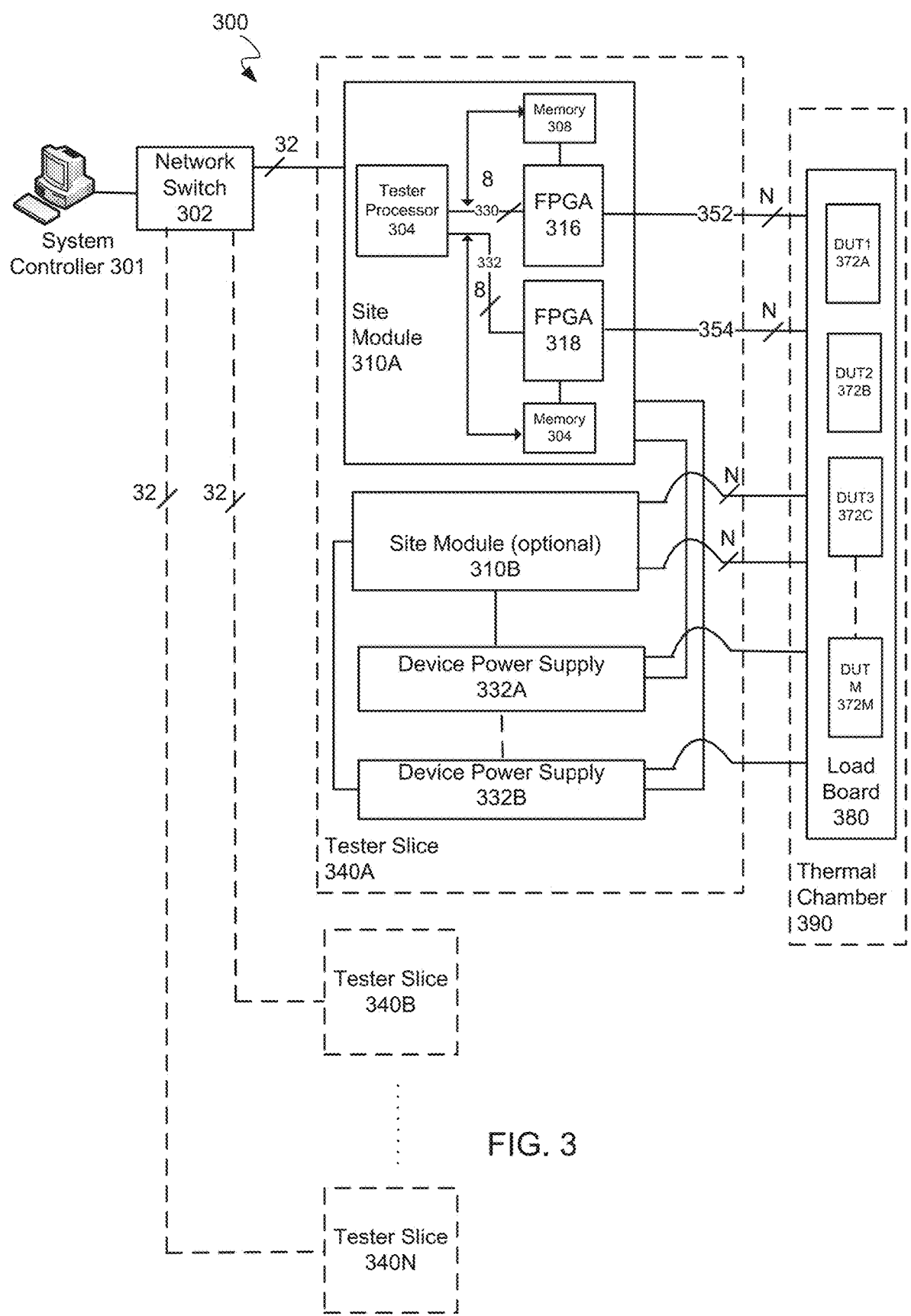
FIG. 3 is a detailed schematic block diagram illustrating an exemplary embodiment of a plurality of tester slices and their interconnections with the system controller and the DUTs.

FIG. 3 is a detailed schematic block diagram illustrating an exemplary embodiment of a plurality of tester slices and their interconnections with the system controller and the DUTs.

Referring to FIG. 3, each tester slice, e.g., 340A-340N comprises site modules. The site modules, in one embodiment, can be mechanically configured onto tester slices 340A-340N, wherein each tester slice comprises at least one site module. In certain typical embodiments, each tester slice can comprise two site modules and two device power supply boards. In other embodiments, the tester slice may comprise more or fewer site modules and/or power supply boards. Tester slice 340A of FIG. 3, for example, comprises site modules 310A and 310B and device power supply boards 332A and 332B. However, there is no limit to the number of device power supply boards or site modules that can be configured onto a tester slice. Tester slice 340 is connected to system controller 301 through network switch 302. Network switch 302 can be connected to each of the site modules with a 32 bit wide bus.

In one embodiment, the system controller 301 may be a computer system, e.g., a personal computer (PC) that provides a user interface for the user of the ATE to load the test programs and run tests for the DUTs connected to the ATE 300. The Advantest Stylus™ Operating System is one example of test software normally used during device testing. It provides the user with a graphical user interface from which to configure and control the tests. It can also comprise functionality to control the test flow, control the status of the test program, determine which test program is running, and log test results and other data related to test flow. In one embodiment, the system controller can be connected to and control as many as 512 DUTs.

In one embodiment, the system controller 301 can be connected to the site module boards 310A-310B through a network switch, such as an Ethernet switch. In other embodiments, the network switch may be compatible with a different protocol such as Fibre Channel, 802.11 or ATM, for instance.

Each of the device power supply boards 332A-332B can be controlled from one of the site modules 310A-310B. The software running on the tester processor 304 can be configured to assign a device power supply to a particular site module. In one embodiment, the site modules 310A-310B and the device power supplies 332A-332B are configured to communicate with each other using a high speed serial protocol, e.g., Peripheral Component Interconnect Express (PCIe), Serial AT Attachment (SATA) or Serial Attached SCSI (SAS), for instance.

In one embodiment, each site module is configured with two FPGAs as shown in FIG. 3. Each of the FPGAs 316 and 318 in the embodiment of FIG. 3 is controlled by the tester processor 304. The tester processor 304 can communicate with each of the FPGAs using a 8 lane high speed serial protocol interface such as PCIe as indicated by system buses 330 and 332 in FIG. 3. In other embodiments, the tester processor 304 could also communicate with the FPGAs using different high speed serial protocols, e.g., Serial AT Attachment (SATA) or Serial Attached SCSI (SAS).

FPGAs 316 and 318 are connected to memory modules 308 and 304 respectively. The memory modules can be coupled with and can be controlled by both the FPGA devices and the tester processor 304.

FPGAs 316 and 318 can be connected to the DUTs 372A-372M on the load board 380 through buses 352 and 354 respectively. The load board 380 is a physical harness that allows a general purpose high speed connection at the site module end that is agnostic to the protocol used to communicate to the DUTs in on lines 352 and 354. At the DUT end, however, the load board needs to be designed so as to have connectors specific to the protocol being used by the DUT. It should be noted that each FPGA can connect to multiple DUTs, wherein each DUT may be executing a different protocol from the other DUTs, e.g., SATA, ATA, SCSI, PCIe, etc.

It should be further noted that FIG. 3 only illustrates an exemplary embodiment of a tester slice. Further, note that embodiments of the present invention are not limited to only the type of tester slices shown in FIG. 3. Embodiments of the present invention can include many different types of tester slices and primitives.

The DUTs 372A-372M, in one embodiment of the invention, are loaded on a load board 380 that is placed inside a thermal chamber 390 for testing. The DUTs 372A-372M and the load board 380 derive power from the device power supplies 332A and 332B.

The number of DUTs that can be connected to each FPGA is contingent on the number of transceivers in the FPGA and the number of I/O lanes required by each DUT. In one embodiment, FPGAs 316 and 318 can each comprise 32 high speed transceivers and buses 352 and 354 can each be 32 bits wide, however, more or less can be implemented depending on the application. If each DUT requires 8 I/O lanes, for example, only 4 DUTs can be connected to each FPGA in such a system.

In one embodiment, the communication protocol used to communicate between the tester processor 304 and the DUTs 372A-M can advantageously be reconfigurable. The communicative protocol engine in such an implementation is programmed directly into one or both of the FPGAs on the tester slice. The FPGA (e.g., 316 or 318) can therefore be configured to communicate with the DUTs in any protocol that the DUTs support. This advantageously eliminates the need for swapping out tester each time a DUT with a different protocol needs to be tested. In one embodiment, the protocols can be high speed serial protocols, including but not limited to SATA, SAS or PCIe, etc. The new or modified protocols can be downloaded and installed directly on the FPGAs via a simple bit-stream download from the system controller through the tester processor without any kind of hardware interactions. Also, if a new protocol is released, the FPGAs can easily be configured with that protocol via a software download.

In one embodiment of the present invention, each FPGA comprises a number of protocol engine modules, wherein each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and SATA protocols, it can be connected to test a DUT that supports both PCIe and SATA protocols. Alternatively, it can be connected to test two different DUTs, one DUT supporting the PCIe protocol and the other DUT supporting the SATA protocol.

Figure 4A:
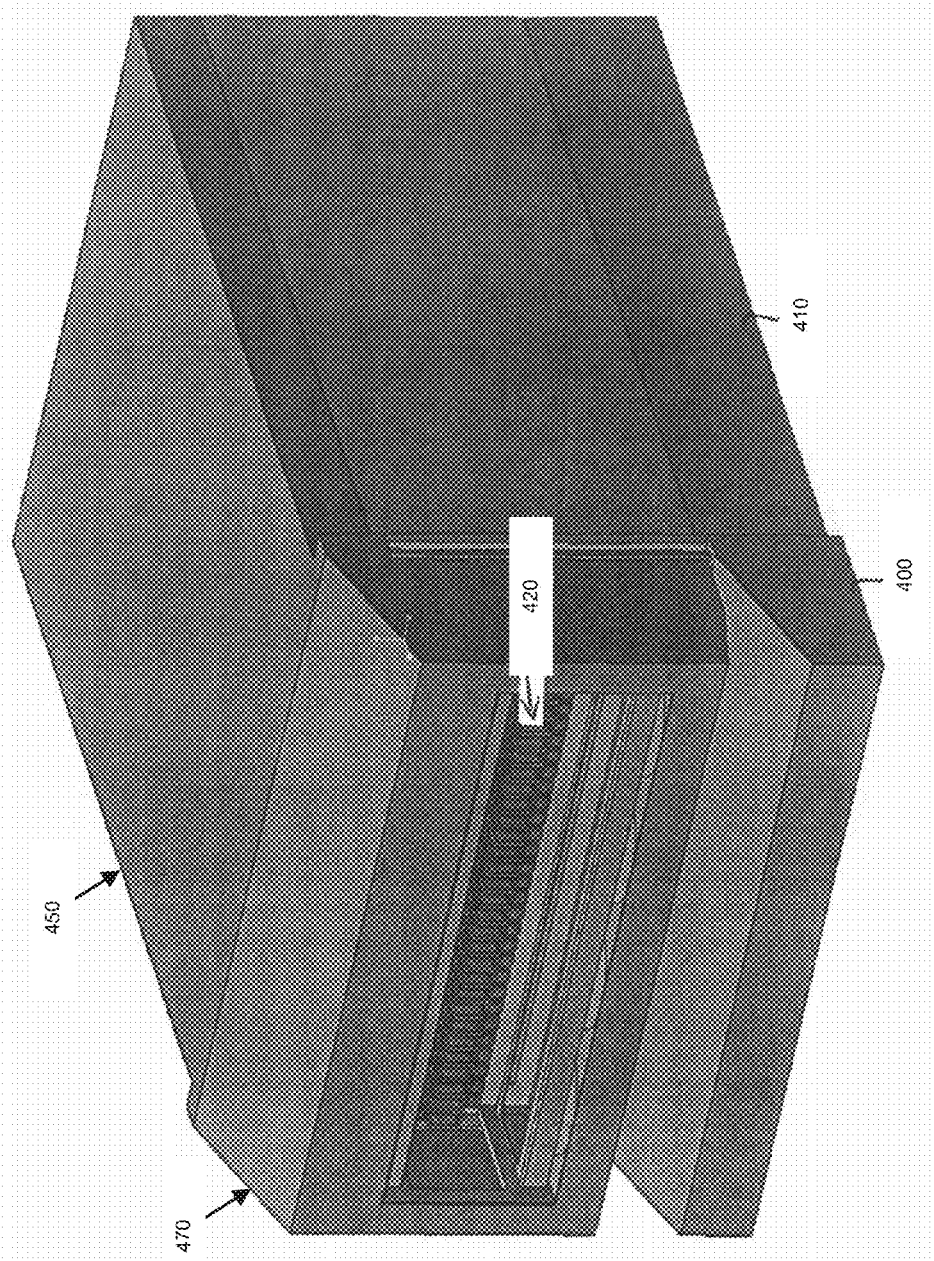
FIG. 4A illustrates a primitive interfaced with a DUT Interface Board (DIB) in accordance with an embodiment of the invention.
Figure 4B:
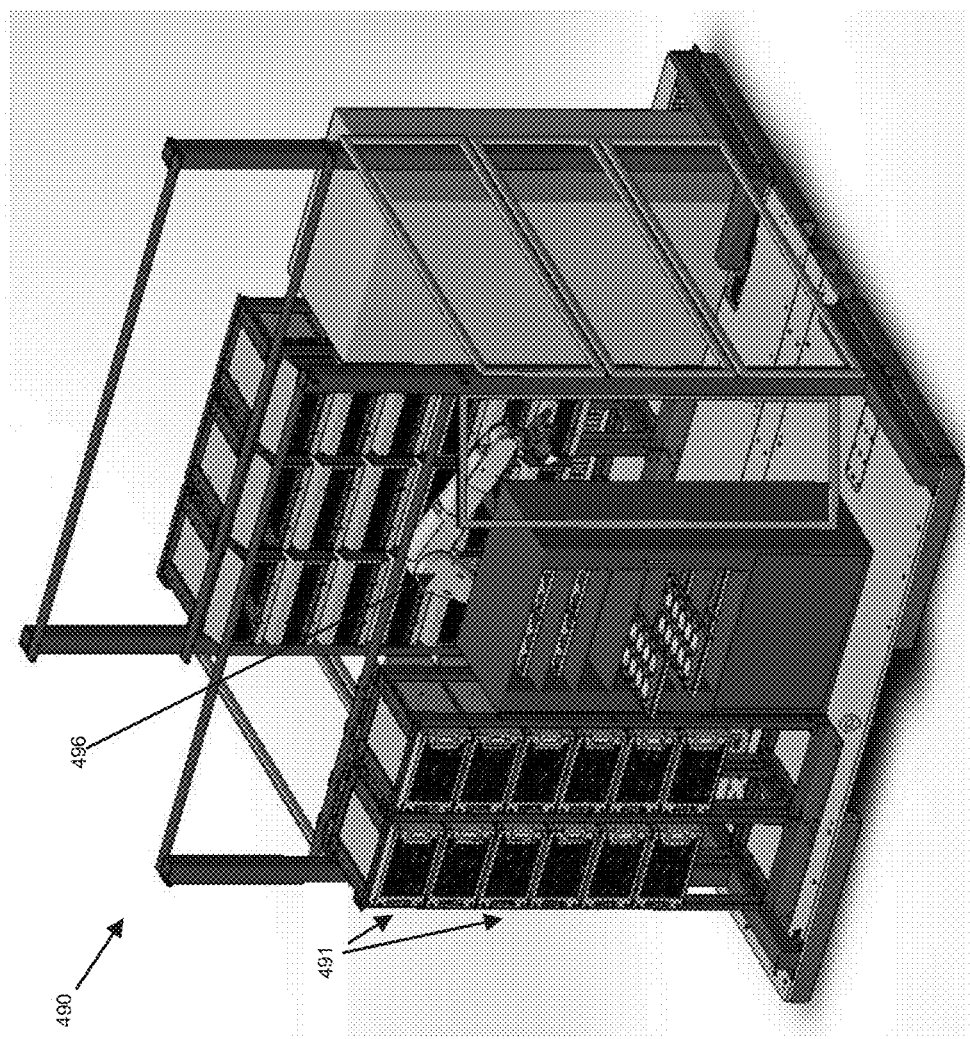
FIG. 4B illustrates an exemplary test cell comprising a plurality of primitives in accordance with an embodiment of the invention.

FIG. 4A illustrates a primitive 410 interfaced with a DUT Interface Board (DIB) 400 in accordance with an embodiment of the invention. Similar to the tester slice 40 shown in FIG. 2, the primitive of FIG. 4A is a type of discrete test module that fits into test head 20 and comprises the test circuitry, which performs tests on the DUTs in accordance with a test plan. A primitive comprises an enclosure 450 within which all the various electronics, e.g., site modules, power supplies, etc. are housed. The DIB 400 can connect with a plurality of DUTs 420 using custom connectors sized for the DUTs 420. The DUTs physically interface and electronically interface to the DIB 400. The primitive can also comprise an enclosure 470. The DIB 400 interfaces to a universal backplane (not shown) of the primitive 410 through a load board (not shown) similar to load board 380 shown in FIG. 3. The primitive 410 contains test circuitry (similar to tester slice 340A shown in FIG. 3) for performing a test plan on the DUTs 420. The primitive 410 can operate independently of any other primitive and is connected to a control server (similar to system controller 301 shown in FIG. 3).

It should be noted that DUTs connected to any given tester slice (e.g., 340A-340N) or any given primitive are capable of running a different protocol than one or more other DUTs connected to the same respective tester slice or primitive. For example, the primitive 410 may be connected to and used to test a plurality of DUTs 420, each of which can run a different protocol, e.g., SATA, ATA, SCSI, etc. In one embodiment, primitive 410 may be connected to and used to test primarily SSD drives.

FIG. 4B illustrates an exemplary test cell 490 comprising a plurality of primitives 491. Embodiments of the present invention utilize a plurality of primitives (similar to the primitive shown in FIG. 4B) and associated DIBs to test the DUTs. Embodiments of the present invention can also use tester slices (similar to tester slice 40 in FIG. 2) to test the DUTs. Each primitive (or tester slice) is modular meaning that it is capable of operating independently from other primitives (or tester slices). Therefore, a plurality of primitives set in a rack (as shown in FIG. 4B) can each be operating under a different test plan. The primitives communicate with a control server for instructions, control, management, etc. The control server can, in one embodiment, be part of the test cell 490. The control server is capable of hosting multiple application programs or test plans for the various primitives it supports. The primitive can communicate with the server via a standard IP network. Various computer systems, which can be located remotely, can access the server via standard IP network connections.

As discussed previously, conventional tester system did not provide automated handlers for DUTs, e.g., SSDs. Embodiments of the present invention provide a robotic handler 496 that automates the physical insertion and removal of DUTs from the primitives. The robot handler 496 can either be a 4-axes, 6-axes, or a multiple axes robot. Furthermore, the robotic handler can utilize exchangeable grippers to handle different form factor DUTs in a test cell. The robot eliminates the need for human labor and achieving higher yield in less time. The automated process can be programmed so that the robot 496 has the intelligence, flexibility and strength to recognize which type of device is being tested automatically and chooses an appropriate gripper for the form factor of the device being tested. Further, in other embodiments, the tester system can also be programmed so that the robots have the intelligence to also determine the orientation of the device in the bins (horizontal or vertical) and the placement of the device. In additional embodiments, the robot is further programmed with the intelligence to grab the device without damaging it by using cameras and external reference points. Using robots leads to, among other things, a more reliable testing process.

Figure 5A:
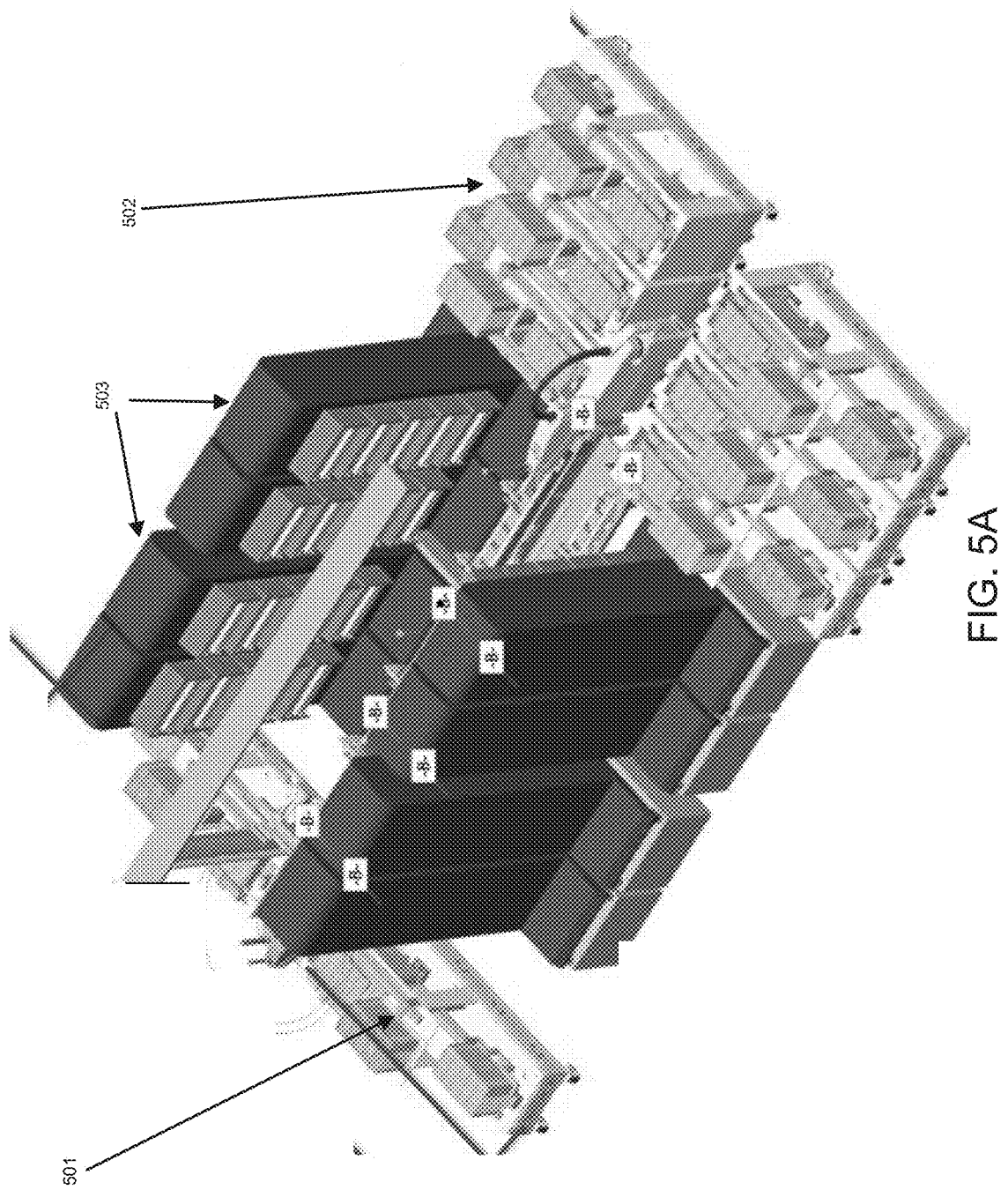
FIG. 5A illustrates an exemplary test cell with loading and binning stations in accordance with an embodiment of the present invention.

FIG. 5A illustrates an exemplary test cell with loading and binning stations in accordance with an embodiment of the present invention. Each test cell receives DUTs from a loading station 501. The DUTs flow from the loading station into the test cell (e.g. using a conveyer belt), where they get inserted by the robot handler into the one or more testers 503 that are part of the test cell. The robot handler can be a multiple-axes robot handler that is capable of loading and moving DUTs in an out of the testers. As mentioned above, each tester can comprise one or more primitives (or tester slices). After the DUTs have been tested, the robot handler will remove the DUTs from the tester and the DUTs will flow out of the test cell (e.g., using the conveyor belts) into output binning stations 502.

Figure 5B:
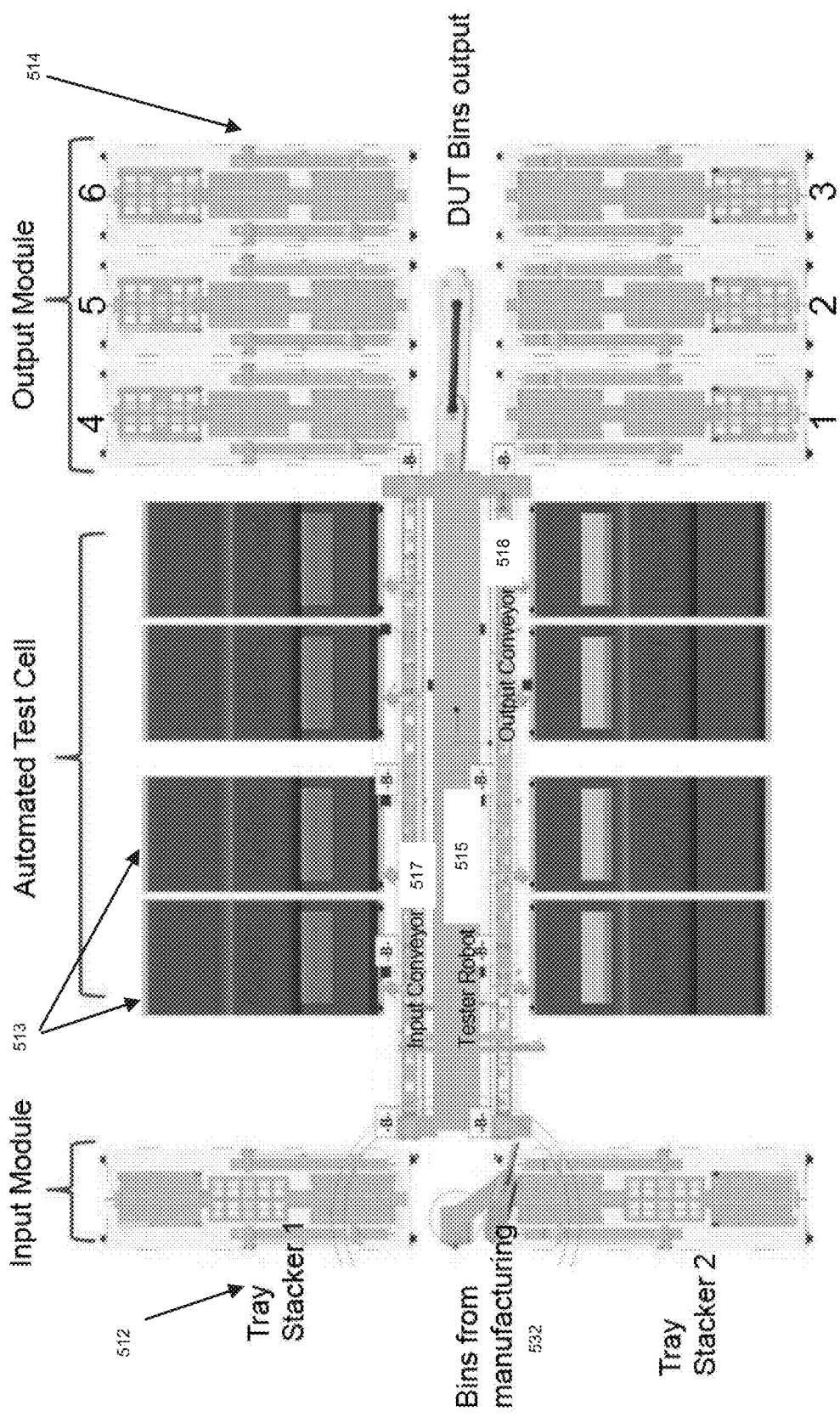
FIG. 5B illustrates another exemplary test cell with a tester robot and conveyers for transferring the DUTs into and out of the test cell in accordance with an embodiment of the present invention.

FIG. 5B illustrates another exemplary test cell with a tester robot and conveyers for transferring the DUTs into and out of the test cell in accordance with an embodiment of the present invention. FIG. 5B is a different view of the test cell from FIG. 5A. The test cells represented in FIGS. 5A and 5B are possible ways of implementing the test cell from FIG. 4B. The DUTs are transferred into the test cell from loading stations comprising one or more tray stackers 512 and bins 532 using an input conveyor 517. The test cells can comprise one or more tester racks 513, where the tester racks can each comprise a plurality of primitives. The tester robot 515 is configured to load the incoming DUTs from the input conveyor 517 into the tester racks in accordance with instructions from the test software (or test development environment). In other words, the tester software controls the tester racks into which each of the incoming DUTs will get inserted. Once the DUTs are tested, the tester robot 515 removes them from the tester racks 513 and transfers them to the output conveyor 518. The output conveyor 518 then transfers the DUTs to the binning stations 514, where the binning stations 514 comprise one or more bins for holding the tested DUTs.

Embodiments of the present invention allow the user to customize the type and number of systems, e.g., number of loading and binning stations, number of conveyor belts, number of robotic handlers, etc. that may be integrated into a single test cell, e.g., test cell 490. The combination of the configurability and modularity of the ATE system allows it to adapt to customer priorities—the customer is allowed to integrate customer-specific modules into the planning process. In one embodiment, the automated handling and customization is also possible for tester systems where the DUTs are placed in an oven, e.g., as shown in FIG. 2.

As mentioned above, because the test equipment is modularized (as shown in FIGS. 4A and 4B for example), the customers are allowed to customize the system to their specific needs. For example, the number of loading stations and binning stations can be configured on a per test cell basis. A customer may be able to decide the number of loading stations, binning stations, test cell robots and/or test racks that are needed in a given test cell. The number of each component in a test cell may be chosen to optimize the test process for efficiency. In addition, the number of tester slices or site modules in a primitive and the types of protocols being tested by the respective tester slice (or slice module) are all configurable. The modularity allows the customer greater control over the testing process.

Customers typically have different requirements in terms of how they are conducting the testing of their devices, what the throughput requirements are, and what their priorities are in terms of how they are directing the DUTs through the tester system. Embodiments of the present invention allow the customers to customize the manner in which to: a) make automation decisions, b) test the devices, c) to process the devices as they proceed through testing, and d) to extract the results. While the base functionality is provided by the standard ATE, the customer is provided ways in which they can customize the testing process to better solve the floor planning needs unique to their testing environment. In one embodiment, the customers are provided with an application programming interface (API) that allows them to enter their customizations and parameters into the tester software. In another embodiment, the customers are provided several program interfaces into the software in order to enter customer specific information.

For example, instances where customers can customize the manufacturing process include the manner in which data is queued to route a device a particular way through the automation process. By way of further example, the customer is also allowed to control the manner in which a DUT is inputted into the test cell and the manner in which the DUT is tested. Further, the customer can also customize the manner in which the information is fed back to the floor planning to make higher level decisions.

As noted above, in one embodiment, the customer is also provided program interfaces (e.g. application programming interfaces) into the test development environment for performing the customization. In other words, embodiments of the present invention focus on providing customers entry points into the default test development environment (of the ATE system) that allows customer customization via program modules.

By way of example, Customer A may want a test cell configured with 8 test racks and 2 loading and binning stations. Customer A may also want to manage priorities such that the DUTs first go through a Built-in Self Test (BIST) test followed by a functional test. Meanwhile Customer B may want a test cell configured with 4 test racks with 1 loading and binning station. Customer C, on the other hand, may have different requirements altogether, such as, needing half the primitives in a test cell to be testing SATA devices while the other half tests PCIE devices. Customer D may want to test only SCSI devices in its test cell (a single protocol for all DUTs).

Embodiments of the present invention allow scheduling of devices and optimizations in the automation process based on customer-specific needs in a way that maximizes throughput for the DUTs. Further, the optimizations performed by embodiments of the present invention minimize idle-time for both the tester and the robot. For example, if the test time for the DUTs is long, this may result in the robot being idle for longer periods—the customer in such case would want to incorporate more testers per cell. If the test time is short, on the other hand, and the robot is overburdened, then the customer may need fewer testers per cell to allow the robot to catch up to the various tasks. The modularity of the test system makes this type of configuration adjustment based on customer need possible. Accordingly, embodiments of the present invention allow such customizations and optimizations, based on customer-specific needs, to be performed within the test development environment.

In one embodiment, the customer specific requirements are inputted into the test program, e.g., information regarding the customers test program, the DUT protocols that need to be tested (e.g., SATA, SCSI, etc.), the interfaces on the DUTs, how long the test programs will run, etc. In response, the software for the test development environment will provide a test cell configuration that would be optimal for the respective customer including the number of testers in a cell, the number of loading stations, the number of binning stations, etc.

In one embodiment, the customer is also allowed to define different objectives. For example, the customer may want to maintain a certain level of throughput for the testers, and can define that as an objective that is inputted into the tester software. By way of further example, the customer is also able to define certain tasks as higher priority than others and execute those tasks in the test cell with higher priority. Further, the customer may want the DUTs to go through several rounds of testing, e.g., BIST testing followed by functional tests—this may require the DUTs to be transferred from one primitive in a given rack in the test cell to a different primitive (performing a different type of test) in another rack of the test cell.

Figure 6:
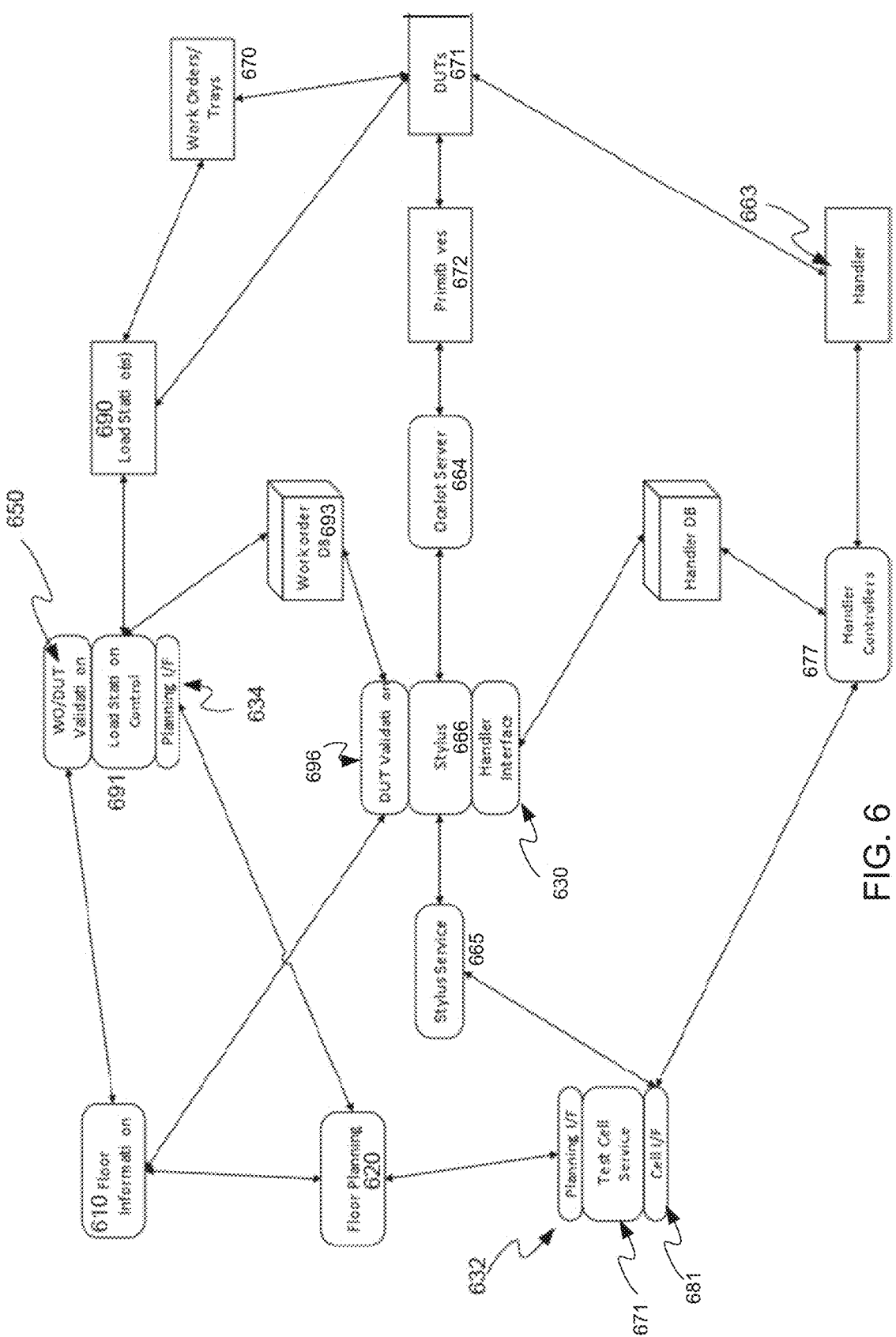
FIG. 6 provides an overview of the major components required for test floor automation and integration in accordance with an embodiment of the present invention.

FIG. 6 provides an overview of the major components required for test floor automation and integration in accordance with an embodiment of the present invention.

FIG. 6 comprises both hardware and software components. The floor information component 610 provides and stores general customer-specific information regarding work orders (pertaining to DUTs that need to be tested), their associated DUTs (e.g., the types of DUTs that need to be tested), the desired test processes, and any resulting results, logs, and data. For example, the floor information component 610 allows the customer to designate high priority lots, the DUT protocols that need to be tested, e.g., PCIe, SATA, etc and the type of testers that will be required to test them. The floor information component 610 transmits the customer-specific information to the WO/DUT validation module 650, and the floor planning component 620 receives information regarding the customer's testing requirements through planning interface module 634 (as will be further explained below).

The floor planning component 620 is typically programmed into the default tester software or test development environment. The floor planning component 620 determines floor and work-order specific scheduling and distributes task allocations for current and future testing work. The work scheduling uses a customer-specific strategy (received from planning interface module 634), e.g., work order due date, shortest production time, least slack time or other considerations. Given work orders of DUTs with different form factors and protocols, the planning would consider the flexibility and shortest set-up time for the testing system. Accordingly, the ATE tester software is configured with a floor-planning component 620 that takes in customer specific information from planning interface module 634 to schedule and allocate tasks in order to maximize throughput.

There is typically a single floor information 610 module and floor planning module 620 for the entire test floor (or production floor). The test floor can, however, comprise a number of test cells. Accordingly, there can be multiple test cell service modules 671 (one for each test cell). The floor planning module 620 determines scheduling and task allocation for the various test cells on the test floor. For example, the floor planning module directs DUTs to the appropriate testers that are capable of or can be configured to be capable of testing the DUTs. The floor planning module may choose the testers based on scheduling requirements or resource requirements.

The test cell service module 671 manages a respective test cell. For example, the test cell service module 671 may transfer data logs for the DUTs in and out of the test cell. The cell interface 681 interfaces with the robot handler (through handler controller module 677).

The floor planning module 620 communicates with planning interface module 632 and planning interface module 634. The test floor automation process provides modules 632 and 634 for customized planning during the testing process.

Planning interface module 634 is invoked during scheduling of the tests and is provided at the load station control module 691. The load station 691 provides information on the incoming work orders, their size, as well as the type and required processing for specific DUTs. The interface 634 provides this information to the floor planning (620) such that it can forecast the upcoming work, make priority and scheduling decisions, and assign testing resources.

Planning interface module 634 is related to a particular lot of DUTs that arrives at the load station to be tested. Planning interface module 634 communicates customer specific planning requirements to floor planning module 620. In one embodiment, the planning interface module 634 communicates information regarding a particular lot of freshly arriving DUTs to the floor planning module, e.g., the work order number, the number of DUTs in the tray, the type of DUTs, the length of the test, the schedule for testing the DUTs, etc.

Planning interface module 634 may, in combination with module 620, also allow different customer priorities and heuristics to be enabled. For example, the customer may have priorities regarding needing to process a certain lot of DUTs faster than others. Planning interface module 634, in combination with floor planning module 620, may define specific criteria regarding the lot of DUTs to be processed and the manner in which they are going to be routed, the testers they will be routed through, and if the DUTs need to do a single-pass or a multi-pass through the testers.

Meanwhile, planning module 632 is provided for test cell services. Planning interface module 632 also interfaces with the floor planning module 620. As mentioned above, each test cell (serviced by Test Cell Service module 671) will comprise its own interface to the floor planning module 620 using the planning interface module 632. The floor planning module 620 may communicate information regarding scheduling and task allocation to the test cell through planning interface module 632, e.g., floor planning module 620 may transmit information regarding a batch of incoming DUTs and the precise rack in the test cell where they need to be inserted. The planning interface module 632 will then perform the allocation under direction from the floor planning module 620. In other words, it will execute and queue tasks according to the directives of the floor planning module 620.

The planning interface 632 also provides status reports back to the floor planning module 620 regarding the manner in which the testing is progressing. For example, the planning interface module 632 may either provide an update to the floor planning module that all the tasks are on-track and progressing adequately. Alternatively, it may alert the floor planning module 620 that certain tasks are progressing slower than usual. The floor planning module 620 may then use this information to determine the manner in which to schedule and distribute further tasks.

The planning interface modules 632 and 634 allow customers to perform specific customizations, e.g., obtain special production data or production status, make decisions regarding high level manufacturing planning etc. The planning modules allow the customer to improve throughput of the system based on the data provided from, e.g., WO/DUT validation module. Based on the data, the customer can make certain decisions to utilize the equipment in a more efficient way, e.g., perform multiple insertions in case the DUT needs to be tested on two different systems within the same test cell. Based on the results of the testing, new decisions can then be made. For example, after the test on the two different systems, if one system is significantly slower, the customer can implement changes to their process to spread more tests to the other system that is more efficient. In other words, the planning modules allow the customer to prioritize their entire test flow better and make decisions based on results of tests in real time.

For example, floor planning component 620 would be provided information regarding the equipment in a particular test cell (e.g., number of racks, robots, primitives, primitive protocol configuration, DIB configuration, etc.), which it may receive from a planning interface module 632 associated with a particular test cell. The floor planning module may also receive information regarding the customer specific constraints, e.g., number and type of DUTs to be tested, priorities for testing, etc. from planning interface module 634. Given information regarding the equipment in a test cell and the number and types of DUTs to be tested, the floor planning module 620 can perform an allocation and optimization to test the various DUTs while maximizing throughput. The floor planning module 620 has information about the resources in each test cell and also has visibility on all the upcoming tests (from planning interface 634). Accordingly, the floor planning module 620 can allocate upcoming tests to available test cells through each test cell's respective planning interface module 632.

The WO/DUT validation component 650 enables customer-specific logic for validating and processing work orders, DUT product types, as well as testing for individual DUTs. This validation is performed at the load station control module 691 when the DUTs arrive at the load station 501. The WO/DUT validation (650) provides the customer with status and supports verification of the incoming work orders and DUTs which will be tested. This processing also defines the required test programs, resources, and data which will be required for the DUT's test process.

When trays of new DUTs arrive at the load station control module 691 fresh out of production, the WO/DUT validation component 650 validates the DUTs and gets them ready for testing (while the planning interface module 634 performs the planning for the test and sends over the DUT related information to the floor planning module 620 and the respective test cells). It also ensures that floor information module 610 knows that the newly arrived DUTs are ready for testing.

The WO/DUT validation component enables the customer to set up customizations for events taking place prior to or subsequent to the test. Based on the type of test the customer is running or based on the systems being used in the customer's test, the customer may want to make certain customizations (e.g. software customizations) to the testing process. The WO/DUT validation component allows the customer to seamlessly perform such customizations within the overall testing processing. The WO/DUT validation component 650 also enables the customer to perform certain optimizations. For example, the WO/DUT validation component allows collateral information to be assigned to the DUT, e.g., data files providing information regarding serial numbers for the DUT, the type of test program, etc. Thereafter, when the DUT is conveyed to the test cell for processing, the test cell service module 671 can use the collateral information to acquire information regarding the DUT, its serial number and the type of tests that need to be run on it. In other words, once WO/DUT Validation module 650 has validated a DUT, it does not need to be validated again at the test cell.

When a batch of incoming DUTs is processed by a load station, the WO/DUT validation module 650 validates and processes the work order using the general customer-specific information from floor information module 610 as discussed above. Information regarding the incoming batch of DUTs along with information regarding the customer's particular testing requirements is transmitted to the floor planning module 620 through planning interface module 634. The floor planning module 620 performs the allocation for the tests based on the customer's requirements—the floor planning module 620 also directs the required resources towards the correct instance of planning interface 632. In other words, because each test cell has its own corresponding planning interface module 632, the floor planning module will need to direct allocated test resources to the correct instance of planning interface 632.

Each test cell (associated with test cell service module 671) may comprise a handler controller module 677, a server 664, a handler 663, primitives 672 and associated DUTs 671, a handler interface 630, a stylus 666 and stylus service 665.

The Handler Interface 630 provides a control and status interface which allows customizing tray, DUT and test processing for different handling equipment (e.g. handler 663) and work flow requirements. The handler interface module 630, for example, may specify a form factor or interface for the DUTs to be tested. The information regarding the form factor for the DUTs needs to be communicated to the handler (or robot) controllers 677 because the gripper on a robot 663 may need to be changed to accommodate the respective form factor.

The load station 690 is a hardware component responsible for presenting DUTs 671 from work orders and trays (module 670) which are configured efficiently for specific Test Cell/Handler configurations. In addition this may include device identification to allow processing prior to actual testing. The load station comprises the robot arm that does the mechanical load processing. If required by customer work flow, a DUT sorter (which is part of the Load Station 690 or work orders/trays module 670) is also responsible for physical binning of tested DUTs to output trays. Otherwise the sorter returns the DUTs to empty input trays.

The Load Station Controller 691 manages the processing of the incoming and outgoing trays and DUTs and updates the Work Order Database 693 for subsequent use. To minimize processing delay in the test cell, initial customer-specific scanning and work order DUT validation (using DUT Validation module 696) can be performed when the DUT is scanned by the sorter. To improve planning, a DUT sort controller (not shown) can provide information on sorter utilization, ongoing work progress, and input and output DUT and tray queues.

The customer is also provided modules, e.g., DUT validation module 696 and WO/DUT validation 650 that allow customers the ability to run validation routines in different locations and at different points within their automation process. The validation modules can, for example, allow the customers to manage their DUTs as carefully as they want to and route them as carefully as they need to. It provides customer, for example, the data on the status of the inventory or the test date as the test flow continues. In most instances, the WO/DUT validation module 650 performs validation for the DUTs when they are loaded at the load station 690—accordingly, the WO/DUT validation module will offload some of the work from DUT validation module 696.

As noted above, the WO/DUT validation (650) provides the customer with status and supports verification of the incoming work orders and DUTs which will be tested. This processing also defines the required test programs, resources, and data which will be required for the DUT's test process. DUT validation (630) is a confirmation prior to testing which checks that the test process is applied to the correct DUT. Meanwhile, DUT validation (696) is a confirmation prior to testing which checks that the test process is applied to the correct DUT.

In one embodiment, stylus service 665 and stylus 666 receive work order information (comprising number of DUTs, DUT protocols to be tested, test times, test interface, test equipment, and priority etc.) from the test cell service modules 671 and configure the equipment or primitives 672 (through server 664) to accommodate the requests in the work order. For example, the stylus 666 chooses the proper DUT protocol and equipment configuration associated with a particular work order. The primitives 672 can then perform the tests on the DUTs 671.

Providing customers the ability to perform optimizations related to their specific tests and systems advantageously provides efficient throughput and cost savings. Prior art systems by comparison did not have any automation for testing their DUTs and could not provide customer specific customizations or optimizations.

In one embodiment, for example, the customer may be able to input a set of constraints specific to the customer into the tester system. The tester software uses the constraints in addition to pre-programmed information regarding the test process to schedule the various tests the customer needs to perform. Further, the tester software determines an optimal layout and configuration of the test equipment for performing the tests.

Embodiments of the present invention allow customer specific criteria and priorities to be taken into account when scheduling tests for DUTs. Because the system is modular (e.g., primitives, DUT protocols, and DIBs can be swapped), the tester software can optimize and customize several aspects of the testing process to maximize throughput based on the customer-specific parameters. The modularity and flexibility of the testing system allows it to accommodate a wide range of scheduling requests—the tester system can be reconfigured in various way to minimize costs and optimize the throughput while taking into account customer specific requirements. For example, the testing system of the present invention can exploit all the modular resources of the system, e.g., the primitives, the robots, loading stations, binning stations, etc. to design a test process for the customer that maximizes throughput and allocation of work to particular pieces of equipment.

Conventional tester systems do not have the flexibility to respond to customer specific priorities. Further, because there is no automation (e.g. automated handlers) in the SSD industry, there is no way to prioritize or optimize certain tasks. The testing process is limited by how fast a human can swap out the DUTs manually from the testers.

Embodiments of the present invention also enable customers to integrate their specific modules into the system—the configurability of the tester system accommodates changes in protocol and allows the customer to easily integrate their requirements into the tester system. Accordingly, embodiments of the present invention advantageously leverage the modularity and flexibility of both the tester hardware and software to allow better production throughput and flexibility with scheduling.

Figure 7:
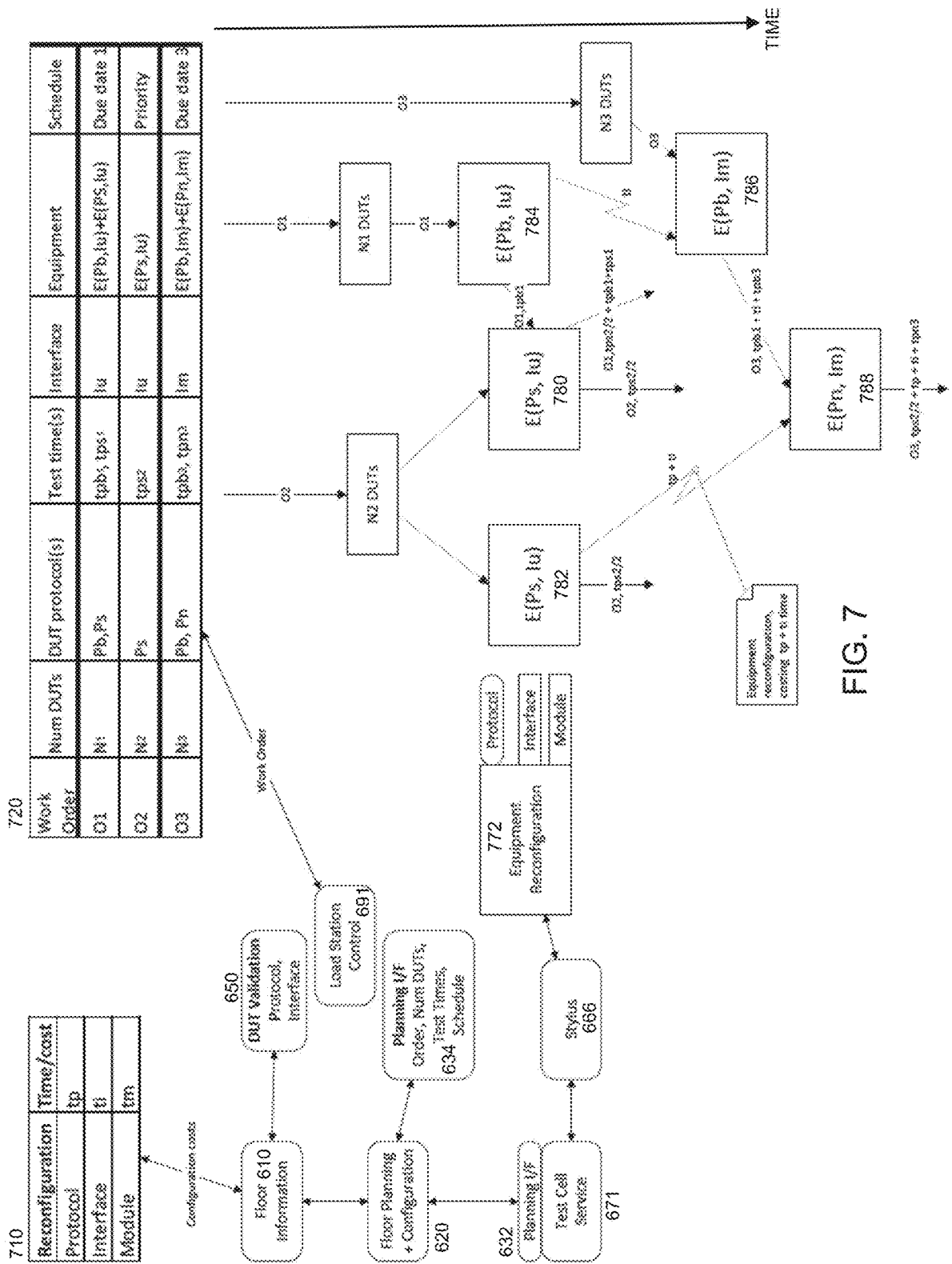
FIG. 7 is a data flow diagram that illustrates the manner in which test floor automation and integration can be used to optimize exemplary work orders in accordance with an embodiment of the present invention.

FIG. 7 is a data flow diagram that illustrates the manner in which test floor automation and integration can be used to optimize exemplary work orders in accordance with an embodiment of the present invention.

As discussed above, embodiments of the present invention provide an ATE system that is modular, wherein the DUT protocols, the primitive modules, and the interface (e.g., DIBs) can be swapped. It should be noted that the DIBs on a primitive can be changed to accommodate different form factor DUTs Similarly, the primitive modules can be swapped too in order to execute different types of tests. For example, different primitive modules may support different types of tests, e.g., BIST tests, functional tests, etc. Performing a BIST test on a primitive designed to run functional tests may be inefficient. Accordingly, the modular nature of the system allows modules to be swapped (in addition to DUT protocols and interfaces) in order to facilitate the requirements of different customers.

While the modularity of the system makes it flexible enough to serve the needs of various different types of customers, swapping either the protocol on a DUT, the interface (or DIB) on a primitive, or a primitive module typically involves some cost, e.g., some amount of time required to make the swap. Table 710 in FIG. 7 indicates exemplary representative reconfiguration costs associated with a change of protocol, interface and module.

Floor information module 610, the DUT validation module 650, the load station control module 691, the floor planning module 620, the planning interface 632 and test cell service module 671, the planning interface module 634, and the stylus 666 perform substantially the same function as indicated in relation to FIG. 6. As shown in FIG. 7, the primitives or equipment can be reconfigured using equipment reconfiguration module 772. The equipment can be reconfigured to support a different protocol, interface or module.

FIG. 7 also illustrates three exemplary work orders, O1, O2 and O3 that are loaded into the test development environment by the load station control module 691.

Work Order 1 (O1) comprises N1 number of DUTs that need to be tested. The protocols on the FPGAs in tester (e.g., FPGAs 316, 318) can be reconfigured to support both the Pb and Ps protocols. The amount of time required to test DUTs executing the Pb protocol is represented by "tpb1" whereas the amount of time to test DUTs executing the Ps protocol is represented by "tps1." The interface (or DIB) used in the primitive for the test is of the "Iu" type. The test equipment (e.g. the primitives) needs to execute the test for DUTs executing the Ps protocol with an Iu interface (represented in table 720 by "E(Pb, Iu)"). Further, the test equipment needs to execute the test for DUTs executing the Ps protocol using an Iu interface (represented in table 720 by "E(Ps, Iu)"). The scheduling priority is represented by "Due date 1" (where Due date 1 is earlier than Due date 3 associated with Work Order 3).

Work Order 2 (O2) comprises N2 number of DUTs that need to be tested. The DUTs to be tested as part of work order 2 execute the Ps protocol. The amount of time required to test DUTs executing the Ps protocol is represented by "tps2." The interface (or DIB) used in the primitive for the test is of the "Iu" type. The test equipment (e.g. the primitives) needs to execute the test for DUTs executing the Ps protocol with an Iu interface (represented in table 720 by "E(Ps, Iu)"). The scheduling priority for work order 2 is high and is represented as a "Priority" work order. In other words, the priority for O2 is higher than the priority for O1 and O3.

Work Order 3 (O3) comprises N3 number of DUTs that need to be tested. The protocols on the FPGAs in tester (e.g., FPGAs 316, 318) can be swapped to support both the Pb and Pn protocols. The amount of time required to test DUTs executing the Pb protocol is represented by "tpb3" whereas the amount of time to test DUTs executing the Pn protocol is represented by "tpn3." The interface (or DIB) used in the primitive for the test is of the "Im" type. The test equipment (e.g. the primitives) needs to execute the test for DUTs executing the Pb protocol with an Im interface (represented in table 720 by "E(Pb, Im)"). Further, the test equipment needs to execute the test for DUTs executing the Pn protocol using an Im interface (represented in table 720 by "E(Pn, Im)"). The scheduling priority is represented by "Due date 3" (where Due date 3 is later than Due date 1 associated with Work Order 1).

As shown in FIG. 7, the load station control 691 receives the three work orders and initiates the process of scheduling the associated tests. The planning interface module 634, among other things, conveys the order information including the number of DUTs, test times and schedule to the floor planning and configuration module 620. As mentioned above, the floor planning and configuration module 620 performs floor and work-order specific scheduling and distributes task allocations for current and future testing work to each of the test cells (represented by test cell service module 671) through planning interface module 632. The respective test cells then use the stylus 666 module to reconfigure the equipment. As discussed above, the stylus 666 chooses the proper DUT protocol and equipment configuration associated with a particular work order. The equipment is then reconfigured using Equipment Reconfiguration module 772.

Work order O2 has the highest priority, as indicated in the flow diagram of FIG. 7, and accordingly, O2 is the first to be initiated. O2 comprises N2 DUTs that are tested use two pieces of equipment "E(Ps,Iu)." The test cell that O2 is processed through may have two pieces of equipment 780 and 782, each of which executing the Ps protocol with an Iu interface. Because O2 is a high priority work order, both pieces of equipment 780 and 782 may be used, as shown in FIG. 7, to process O2. The floor planning and configuration module 620 will optimize the use of the equipment in the test cells by allocating tasks to both testers in a way that maximizes the throughput of the N2 DUTs. Because the testing task for O2 is split over two testers, it takes half the amount of time to process the N2 DUTs. Accordingly, as shown in FIG. 7, the testing time for O2 is tps2/2.

Work order 1 (O1) is the next highest priority task. Because part of O1 requires equipment executing a different type of protocol (Pb) (different from the Ps protocol required by O2), its resource requirements are not in competition with O2. Therefore, O1 can be started in parallel with O2 on a different piece of equipment 784 represented by a "E(Pb, Iu)." In other words, the part of the O1 test requiring equipment executing the Pb protocol can be initiated in parallel with O2. This part of the O1 work order completes in time tpb1. The remaining half of the O1 work order requires the same equipment as the O2 work order. Accordingly, as shown in FIG. 7, the floor planning and configuration module 620 may optimize throughput by scheduling the remaining half of the O1 work order to one of the same pieces of equipment (equipment 780) that was used to process the O2 order. The total time required to process O1 therefore is tpb1+tps1+tps2/2 (where tps2/2 is the amount of time O1 needed to wait for the O2 work order to finish using equipment 780).

Work Order 3 (O3) starts later than O1 and O2 because it has the lowest priority of the tests in table 720 and because the test uses equipment used by O1 and O2—accordingly, the floor planning module 620 would need to stall O3 in order to wait for O1 and O2 to finish and also allow for time to accommodate any interface or protocol changes.

As stated above, O3 needs to wait for equipment 784 to finish so it can re-configure it with an Im type interface to test DUTs executing the Pb protocol. The amount of time needed to reconfigure equipment 786 is represented by "ti" (as shown in table 710 ti is the cost associated with an interface change). Part of O3 can thereafter be executed using equipment 788 (which is the same piece of equipment as was used for O1 but with an interface change). The total amount of time it takes to execute the first part of O3 is therefore represented by tpb1+ti+tpb3.

To execute the second part of O3, equipment 782 needs to be reconfigured to test a different protocol with a different interface. Accordingly, equipment 782 is switched from testing DUTs with the Ps protocol to testing DUTs using the Pm protocol. Similarly, the interface is changed from Iu to Im. This reconfiguration takes a total duration of tp+ti (as shown in FIG. 7). Equipment 788 (which is a re-purposed version of equipment 782) is now used to run the second part of O3. The total amount of time it takes for this test to finish therefore is tps/2+tp+ti+tpn3.

In this scenario, floor planning module 720 may determine, for example, that it is more efficient to reconfigure equipment 782 to execute the second part of the O3 test rather than to wait for equipment 786 to finish running the first part of O3.

As noted previously, the floor planning module 720 (in conjunction with the other modules) allows customer specific criteria and priorities to be taken into account when scheduling tests for DUTs (as illustrated in FIG. 7). Because the system is modular (e.g., primitives, DUT protocols, and DIBs can be swapped), the tester software can optimize and customize several aspects of the testing process to maximize throughput based on the customer-specific parameters. The flexibility of the testing system allows it to accommodate a wide range of scheduling requests—the tester system can be reconfigured in various way to minimize costs and optimize the throughput while taking into account customer specific requirements.

Figure 8:
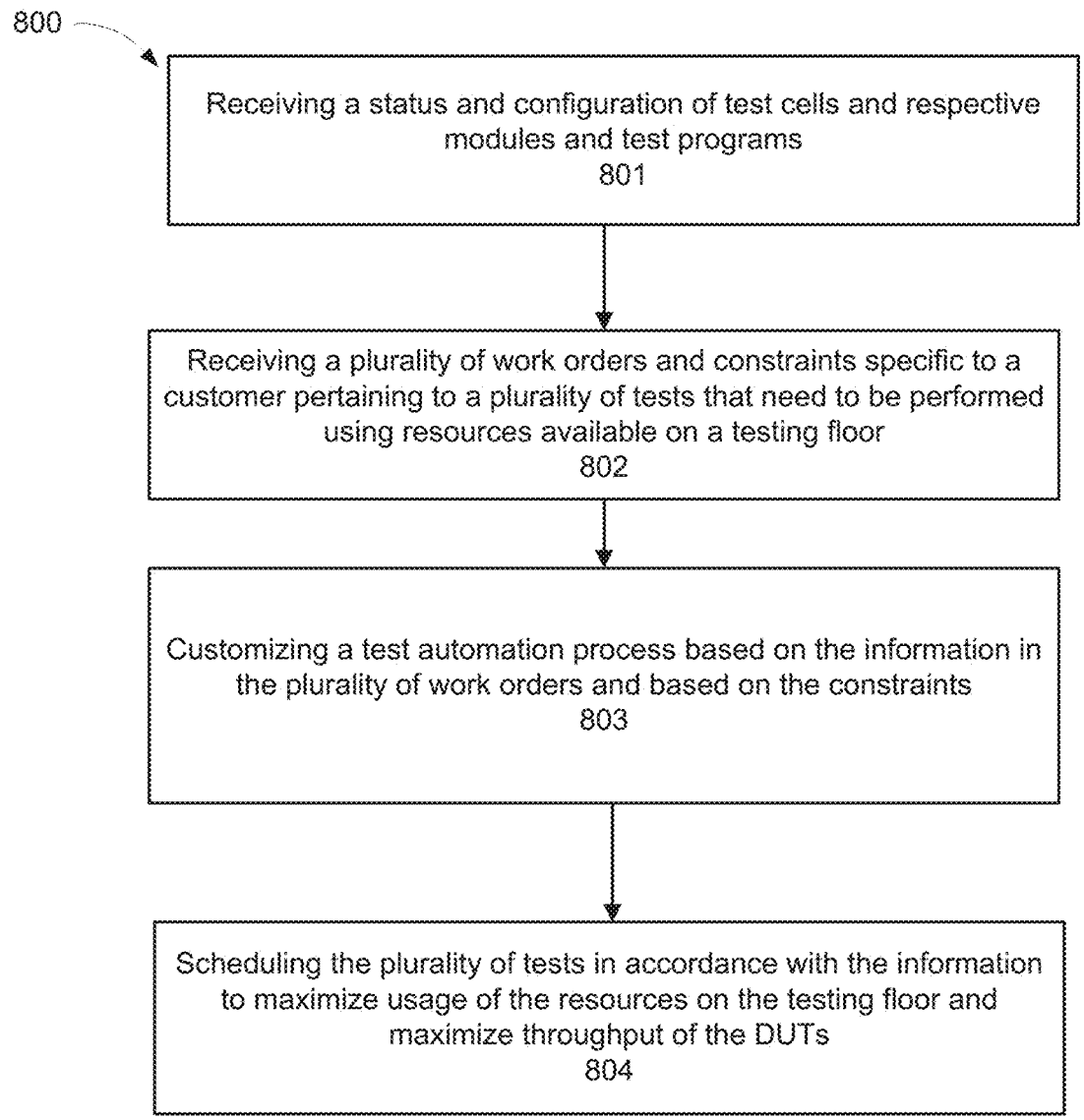
FIG. 8 illustrates a flowchart of an exemplary computer implemented process for scheduling the handling of devices during test automation in accordance with embodiments of the present invention.

FIG. 8 illustrates a flowchart 800 of an exemplary computer implemented process for optimizing the scheduling and handling of devices during test automation in accordance with embodiments of the present invention.

At step 801, a status and configuration of the various test cells on the test floors and their respective modules and test programs is received by the tester software. As explained above, the planning interface 632 provides status reports to the floor planning module 620 regarding the test cells on the test floor and the respective modules.

At step 802, the tester software receives a plurality of work orders pertaining to a plurality of tests that need to be performed and a plurality of customer specific constraints through an application programming interface. The work orders and constraints pertain to a plurality of tests that need to be performed using testing resources available on the test floor or production floor. As noted previously, the tester software uses the constraints in addition to pre-programmed information regarding default test processes to schedule the various tests (from the work orders) the customer needs to perform.

At step 803, the test automation process is customized based on the information in the work orders, the customer specific constraints, and on the testing resources available in the various test cells on the testing floor.

At step 804, the tests are scheduled at the various test cells in accordance with the directives in the work orders and customer specific constraints in a way that maximizes the use of the resources in the test cells and DUT throughput.

Figure 9:
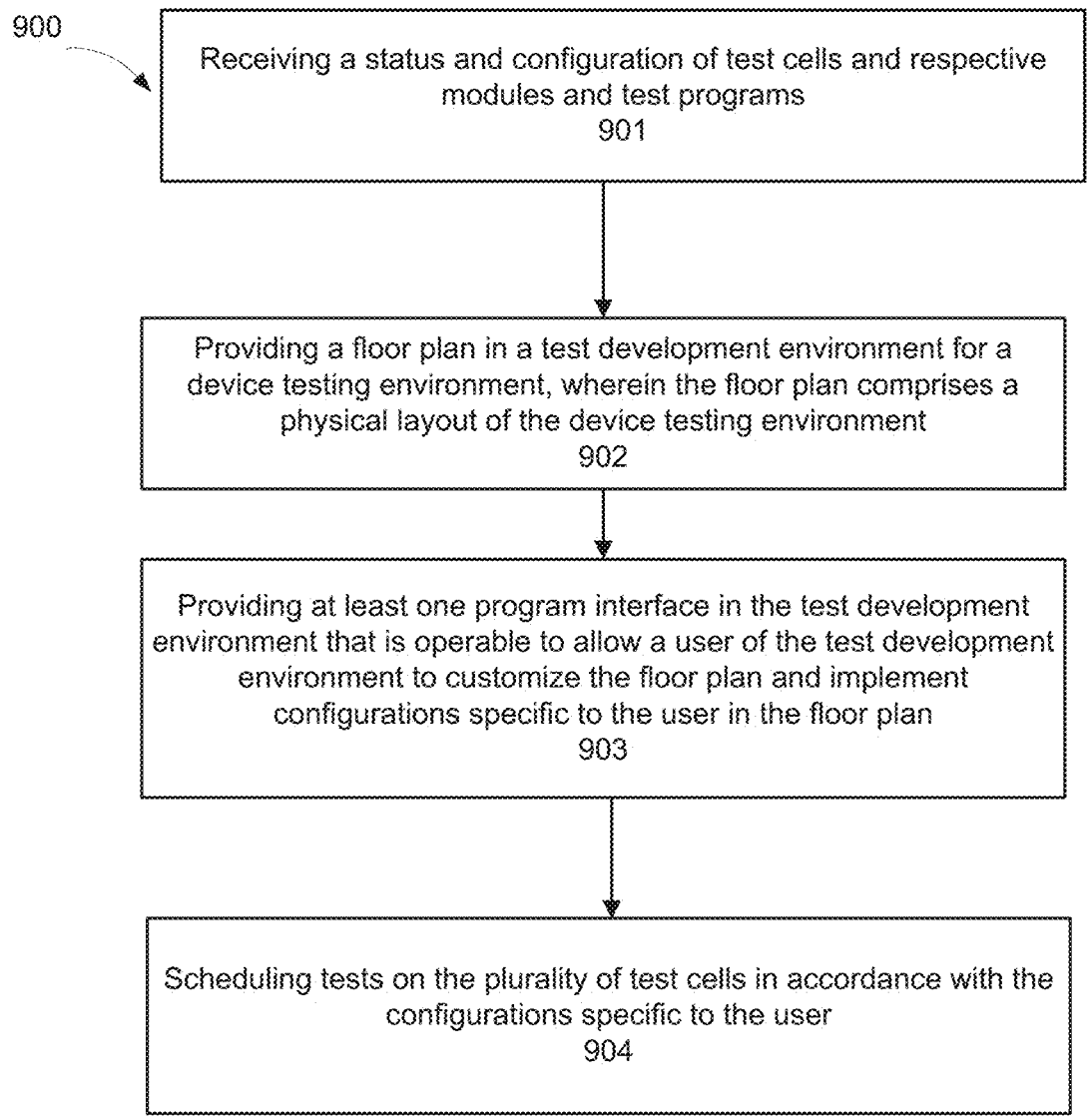
FIG. 9 illustrates a flowchart of an exemplary computer implemented process for customizing the scheduling and handling of devices during test automation in accordance with embodiments of the present invention.

FIG. 9 illustrates a flowchart 900 of an exemplary computer implemented process for customizing the scheduling and handling of devices during test automation in accordance with embodiments of the present invention.

At step 901, a status and configuration of the various test cells on the test floors and their respective modules and test programs is received by the tester software. As explained above, the planning interface 632 provides status reports to the floor planning module 620 regarding the test cells on the test floor and the respective modules.

At step 902, tester software provide a floor plan in a test development environment for a device testing environment. The floor plan comprises a physical layout of the device testing environment. The device testing environment comprises a plurality of test cells, wherein each test cell comprises at least one loading station, at least one binning station, at least one robotic handler for handling devices under test (DUTs), and at least one tester rack comprising a plurality of primitives. Further, each primitive is operable to test a plurality of devices under test (DUTs).

At step 903, the tester software provides at least one program interface in the test development environment operable to allow a user of the test development environment to customize the floor plan and implement configurations specific to the user in the floor plan.

Finally, at step 904, the tester software schedules tests on the plurality of test cells in accordance with the configurations specific to the user.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A method of scheduling tests for automated test equipment (ATE), the method comprising:
   providing a floor plan in a test development environment for a device testing environment, wherein the test development environment is configured on a computing device, wherein the device testing environment comprises a plurality of test cells, wherein each test cell comprises at least one loading station configured to load one or more devices under test (DUTs) into a respective test cell, at least one binning station configured to hold one or more DUTs transferred out of a respective test cell, at least one robotic handler configured to insert one or more DUTs into and remove one or more DUTs from a plurality of primitives associated with a respective test cell, and at least one tester rack comprising the plurality of primitives, wherein each primitive of the plurality of primitives is operable to test a plurality of DUTs, wherein a primitive comprises an enclosure and a board to interface with associated DUTs, and wherein each primitive can operate independently of other primitives in the plurality of primitives, and wherein the floor plan comprises a physical layout of the device testing environment; and
   providing at least one program interface in the test development environment operable to allow a user of the test development environment to customize the floor plan and implement configurations specific to the user in the floor plan; and
   scheduling tests on the plurality of test cells in the device testing environment in accordance with the configurations specific to the user implemented into the floor plan, wherein the scheduling comprises allocating components of the plurality of test cells in the floor plan in accordance with the configurations specific to the user to maximize usage of the components of the plurality of test cells.

2. The method of claim 1, wherein the configurations are selected from a group consisting of: number of DUTs, protocols executed by the DUTs, test times, test interface, available test equipment, and testing priority.

3. The method of claim 1, wherein the configurations are inputted into the at least one program interface using work orders.

4. The method of claim 1, wherein the configurations are selected to optimize a speed at which the plurality of DUTs are transferred in and out of the plurality of test cells in the device testing environment.

5. The method of claim 1, wherein the at least one program interface is further operable to allow the user to perform reconfigurations, wherein the reconfigurations are selected from the group consisting of: swapping one of more primitive modules, swapping an interface on one or more primitive modules, and swapping a protocol for testing a plurality of DUTs.

6. The method of claim 1, wherein the scheduling further comprises:
   allocating components of the plurality of test cells in the floor plan in accordance with the configurations specific to the user to maximize DUT throughput.

7. A method for performing tests using automated test equipment (ATE), said method comprising:
   receiving a plurality of work orders for scheduling a plurality of tests on a plurality of devices under test (DUTs) using automated test equipment (ATE) available on a production floor, wherein the ATE comprises a plurality of test cells, wherein each test cell comprises a plurality of testers and an automated handler comprising a robotic handler configured to insert one or more DUTs of the plurality of DUTs into and remove one or more DUTs of the plurality of DUTs from a plurality of primitives associated with a respective test cell, wherein a primitive comprises an enclosure and a board to interface with associated DUTs, and wherein each primitive can operate independently of other primitives in the plurality of primitives, and wherein the plurality of work orders comprises a plurality of constraints specific to a customer;
   developing a floor plan to execute the plurality of tests, wherein the floor plan is customized in accordance with the information in the plurality of work orders; and
   scheduling the plurality of tests to the plurality of test cells in accordance with the plurality of constraints specified in the plurality of work orders to maximize throughput of the plurality of DUTs, wherein the plurality of constraints are selected to optimize a speed at which the plurality of DUTs are transferred in and out of the plurality of test cells in the device testing environment.

8. The method of claim 7, wherein each test cell comprises at least one loading station configured to load one or more devices under test (DUTs) into a respective test cell, at least one binning station configured to hold one or more DUTs transferred out of a respective test cell, the automated handler, and at least one tester rack comprising the plurality of primitives, wherein each primitive is operable to test one or more DUTs of the plurality of DUTs.

9. The method of claim 8, wherein the plurality of work orders are received through an application programming interface in a test development environment implemented on a server, wherein the server is communicatively coupled to the ATE.

10. The method of claim 9, wherein the application programming interface is further operable to allow the user to perform reconfigurations, wherein the reconfigurations are selected from the group consisting of: swapping one of more primitive modules, swapping an interface on one or more primitive modules, and swapping a protocol for testing a plurality of DUTs.

11. The method of claim 7, wherein the plurality of constraints are selected from a group consisting of: number of DUTs, protocols executed by the DUTs, test times, cost, test interface, available test equipment, and testing priority.

12. A system for performing tests using automated test equipment (ATE), the system comprising:
   a device testing environment comprising a plurality of test cells, wherein each test cell comprises at least one loading station configured to load one or more devices under test (DUTs) into a respective test cell, at least one binning station configured to hold one or more DUTs transferred out of a respective test cell, at least one robotic handler configured to insert one or more DUTs into and remove one or more DUTs from a plurality of primitives associated with a respective test cell, and at least one tester rack comprising the plurality of primitives, wherein each primitive of the plurality of primitives is operable to test a plurality of DUTs, wherein a primitive comprises an enclosure and a board to interface with associated DUTs, and wherein each primitive can operate independently of other primitives in the plurality of primitives;

a server operable to implement a test development environment for the device testing environment, wherein the server is communicatively coupled to the device testing environment and is configured to:
    implement a floor plan for the device testing environment, wherein the floor plan comprises a physical layout of the device testing environment; and
    provide at least one program interface in the test development environment operable to allow a user of the test development environment to customize the floor plan and implement configurations specific to the user in the floor plan; and
    schedule tests on the plurality of test cells in the device testing environment in accordance with the configurations specific to the user implemented into the floor plan by allocating components of the plurality of test cells in the floor plan in accordance with the configurations specific to the user to maximize usage of the components of the plurality of test cells.

13. The system of claim 12, wherein the configurations are selected from a group consisting of: number of DUTs, protocols executed by the DUTs, test times, test interface, available test equipment, and testing priority.

14. The system of claim 12, wherein the configurations are inputted into the at least one program interface using work orders.

15. The system of claim 12, wherein the configurations are selected to optimize a speed at which a plurality of DUTs are transferred in and out of the plurality of test cells in the device testing environment.

16. A system for performing tests using automated test equipment (ATE), the system comprising:

a device testing environment comprising a plurality of test cells, wherein each test cell comprises at least one loading station configured to load one or more devices under test (DUTs) into a respective test cell, at least one binning station configured to hold one or more DUTs transferred out of a respective test cell, at least one robotic handler configured to insert one or more DUTs into and remove one or more DUTs from a plurality of primitives associated with a respective test cell, and at least one tester rack comprising a plurality of primitives, wherein each primitive is operable to test a plurality of DUTs; and a server operable to implement a test development environment for the device testing environment, wherein the server is communicatively coupled to the device testing environment and is configured to:
    receive a plurality of work orders for scheduling a plurality of tests on a plurality of DUTs, wherein the plurality of work orders comprises a plurality of constraints specific to a customer;
    develop a floor plan to execute the plurality of tests, wherein the floor plan is customized in accordance with the information in the plurality of work orders; and
    schedule the plurality of tests to the plurality of test cells in accordance with the plurality of constraints specified in the plurality of work orders to maximize throughput of the plurality of DUTs, wherein the plurality of constraints are selected to optimize a speed at which the plurality of DUTs are transferred in and out of the plurality of test cells in the device testing environment.

17. The system of claim 16, wherein the plurality of constraints are selected from a group consisting of: cost, number of DUTs, protocols executed by the DUTs, test times, test interface, available test equipment, and testing priority.

18. The system of claim 16, wherein the plurality of work orders are received through an application programming interface in the test development environment.

\* \* \* \* \*